United States Patent
Ichihara et al.

(10) Patent No.: US 8,355,275 B2
(45) Date of Patent: Jan. 15, 2013

(54) RESISTANCE CHANGE MEMORY

(75) Inventors: Reika Ichihara, Yokohama (JP); Akira Takashima, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/239,899

(22) Filed: Sep. 22, 2011

(65) Prior Publication Data

US 2012/0250394 A1 Oct. 4, 2012

(30) Foreign Application Priority Data

Mar. 30, 2011 (JP) ................... 2011-076283

(51) Int. Cl.
*G11C 11/00* (2006.01)
(52) U.S. Cl. .................... 365/148; 365/189.16
(58) Field of Classification Search ............ 365/148, 365/158, 163, 171, 173, 189.16
See application file for complete search history.

(56) References Cited

U.S. PATENT DOCUMENTS

| 2011/0069532 A1* | 3/2011 | Ichihara et al. | 365/148 |
| 2011/0228590 A1* | 9/2011 | Murooka | 365/148 |
| 2012/0063193 A1* | 3/2012 | Ichihara | 365/148 |

OTHER PUBLICATIONS

U.S. Appl. No. 13/053,677, filed Mar. 22, 2011, Reika Ichihara.
U.S. Appl. No. 13/234,796, filed Sep. 16, 2011, Akira Takashima et al.
K. Kinoshita, et al., "Reduction in the reset current in a resistive random access memory consisting of NiOx brought about by reducing a parasitic capacitance", Applied Physics Letters 93, 2008, 3 Pages.

* cited by examiner

*Primary Examiner* — Tuan T Nguyen
*Assistant Examiner* — Lance Reidlinger
(74) *Attorney, Agent, or Firm* — Oblon, Spivak, McClelland, Maier & Neustadt, L.L.P.

(57) ABSTRACT

According to one embodiment, a resistance change memory includes a memory cell including a resistance change element and a stacked layer structure which are connected in series, a control circuit configured to control a first operation of changing the resistance change element from a first resistance value to a second resistance value lower than the first resistance value, and a voltage pulse generating circuit configured to generate a first voltage pulse to be applied to the memory cell in the first operation. The stacked layer structure includes two conductive layers and an insulating layer formed between the two conductive layers. Amplitude of the first voltage pulse is in a first voltage area in which the stacked layer structure functions as a capacitor. The first voltage pulse satisfies Ron× C<T-lead<Roff×C and Ron×C<T-trail.

16 Claims, 10 Drawing Sheets

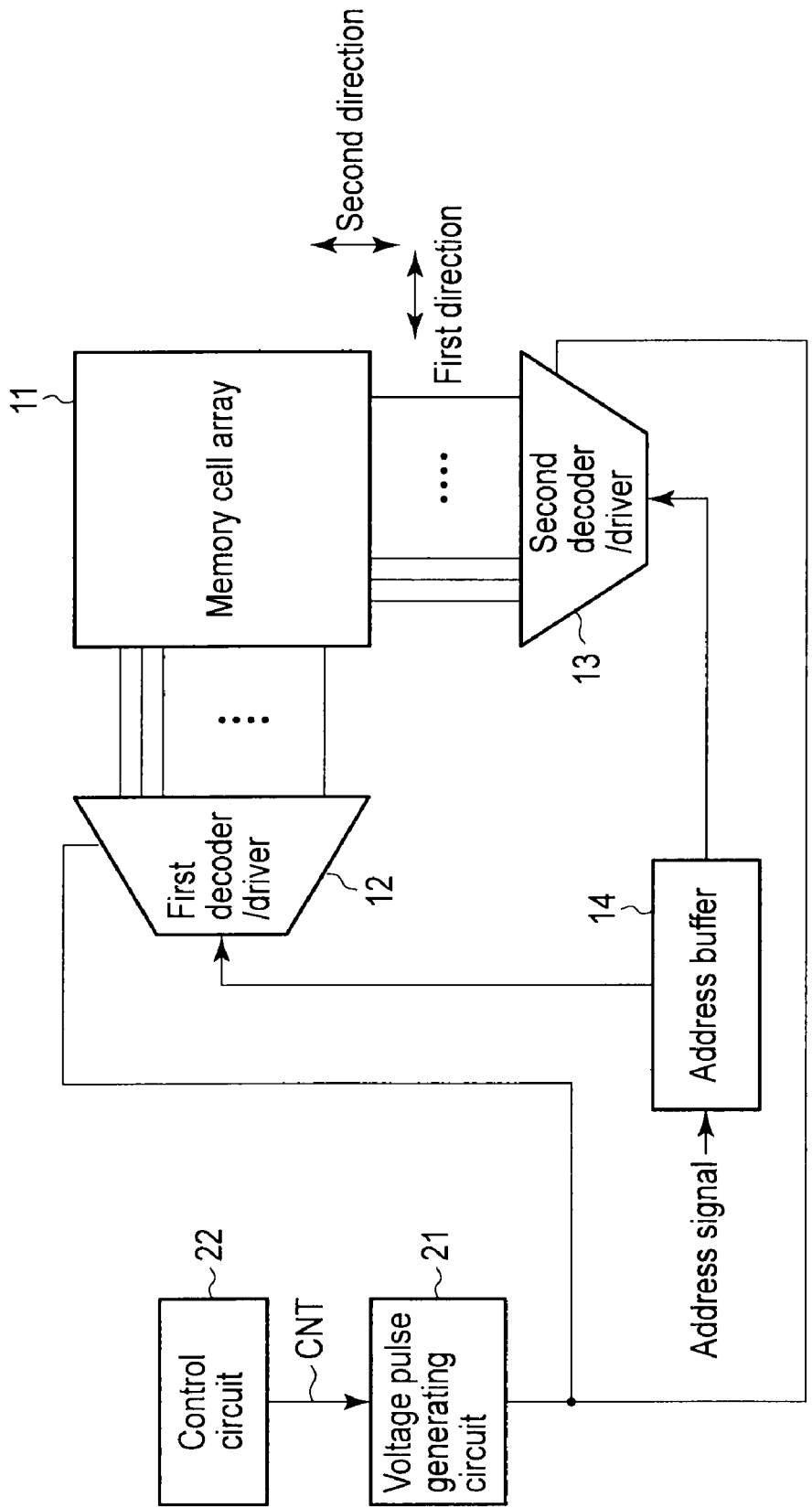
F I G. 1

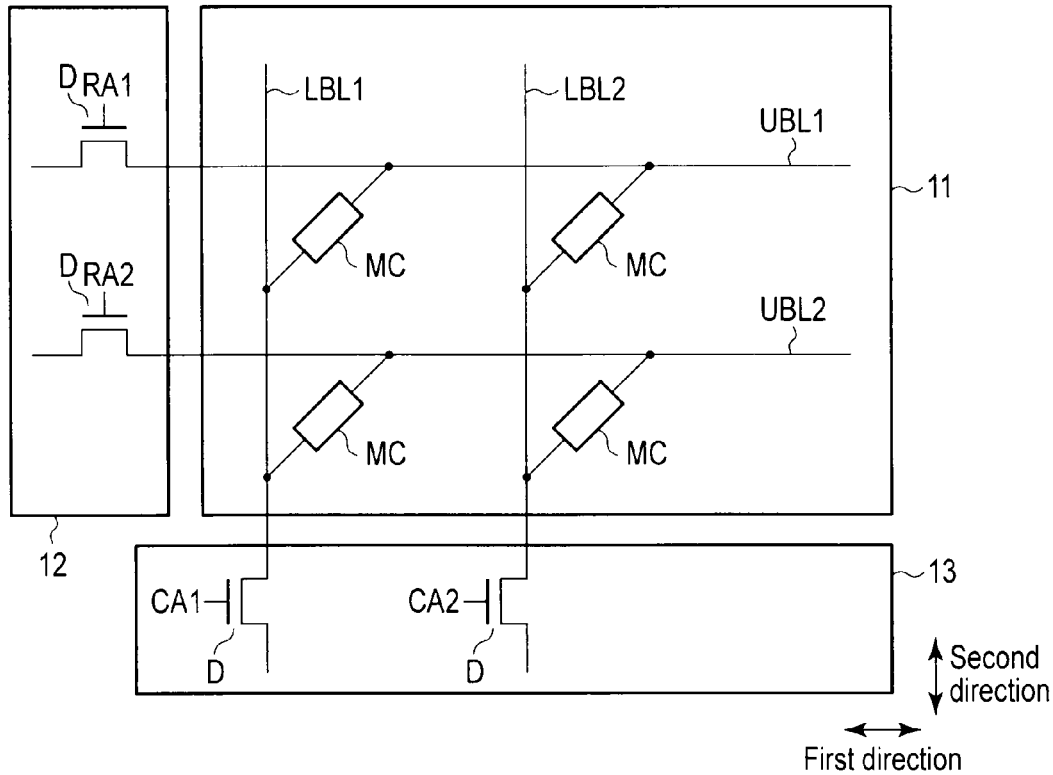
F I G. 2
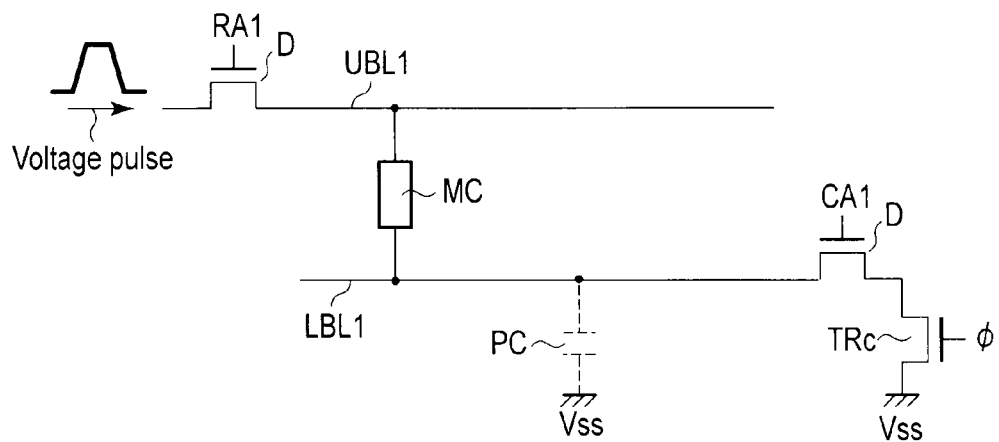
F I G. 3

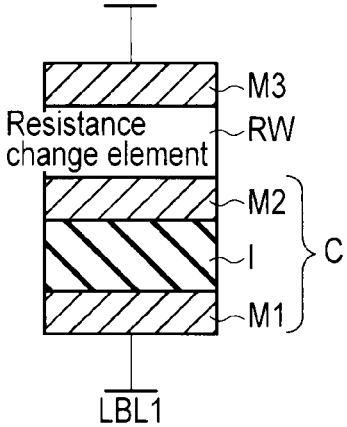
F I G. 4
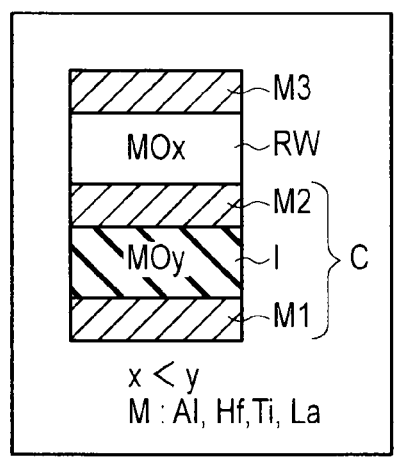
F I G. 5

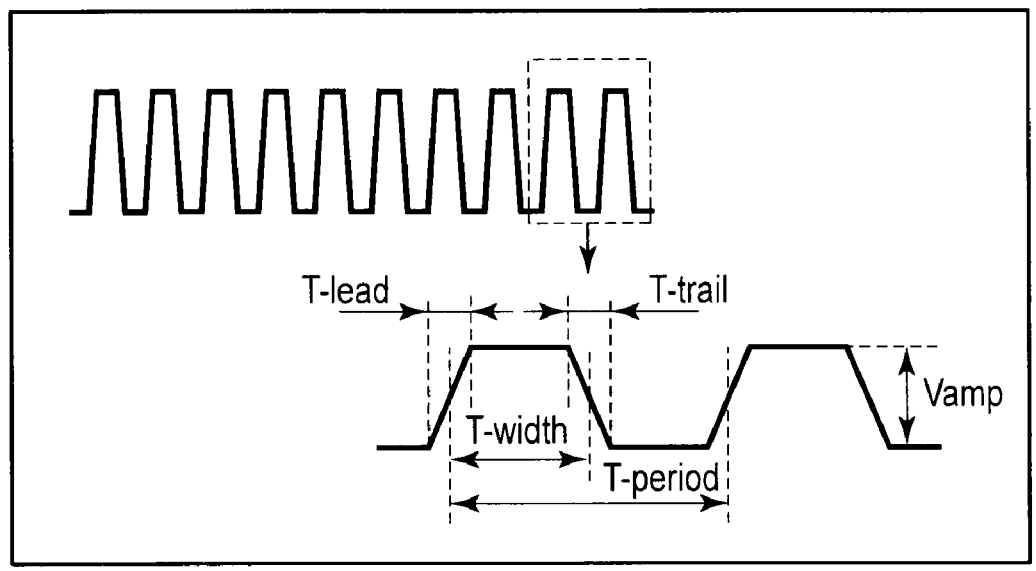
F I G. 6

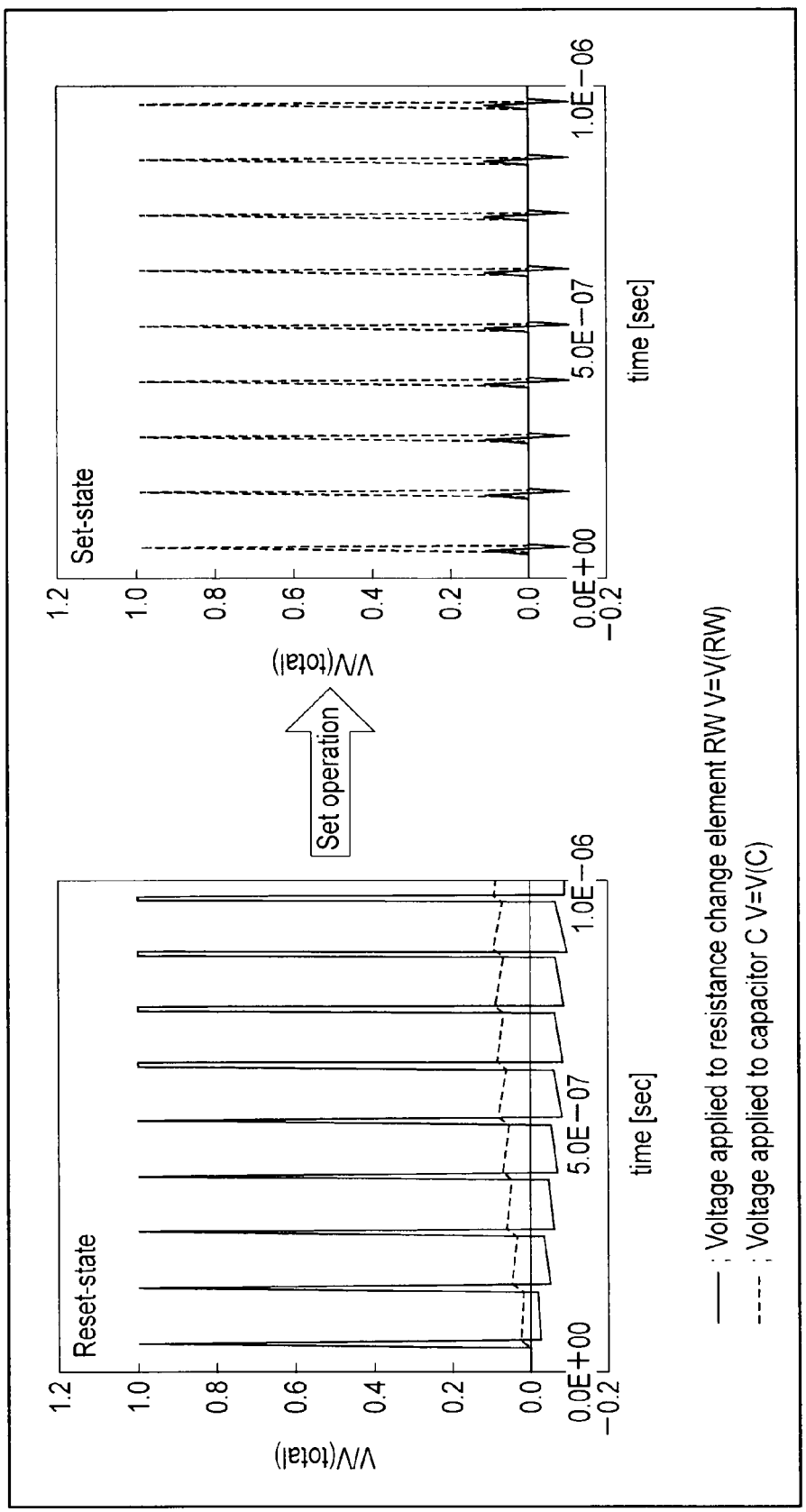
F I G. 7

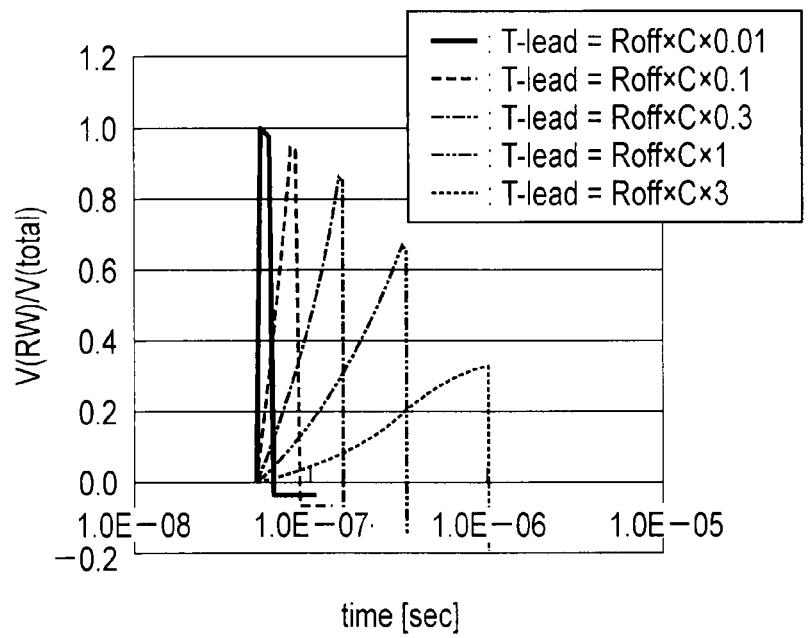
F I G. 8
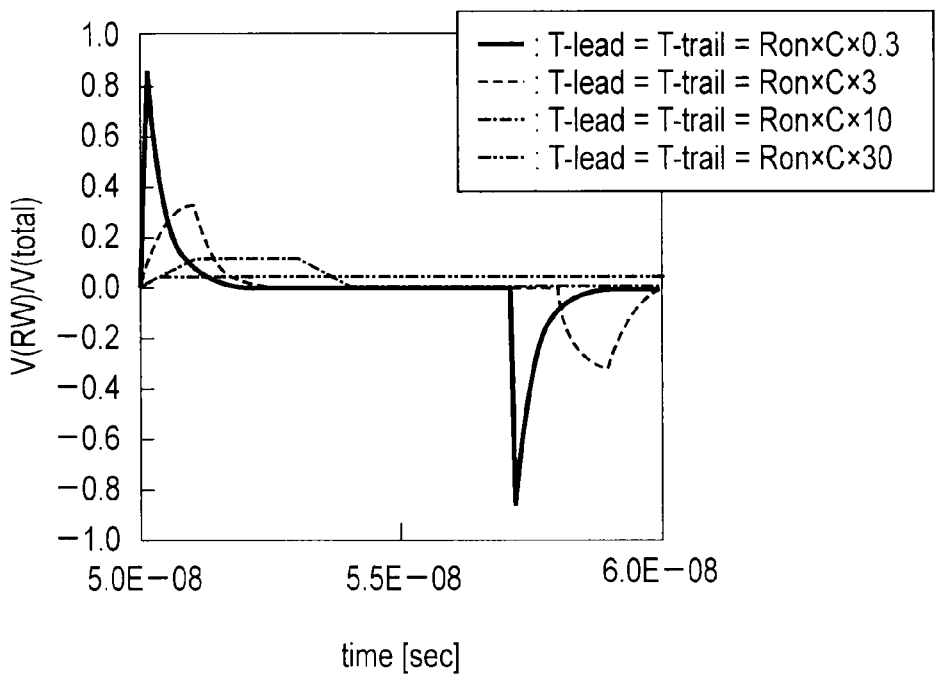
F I G. 9

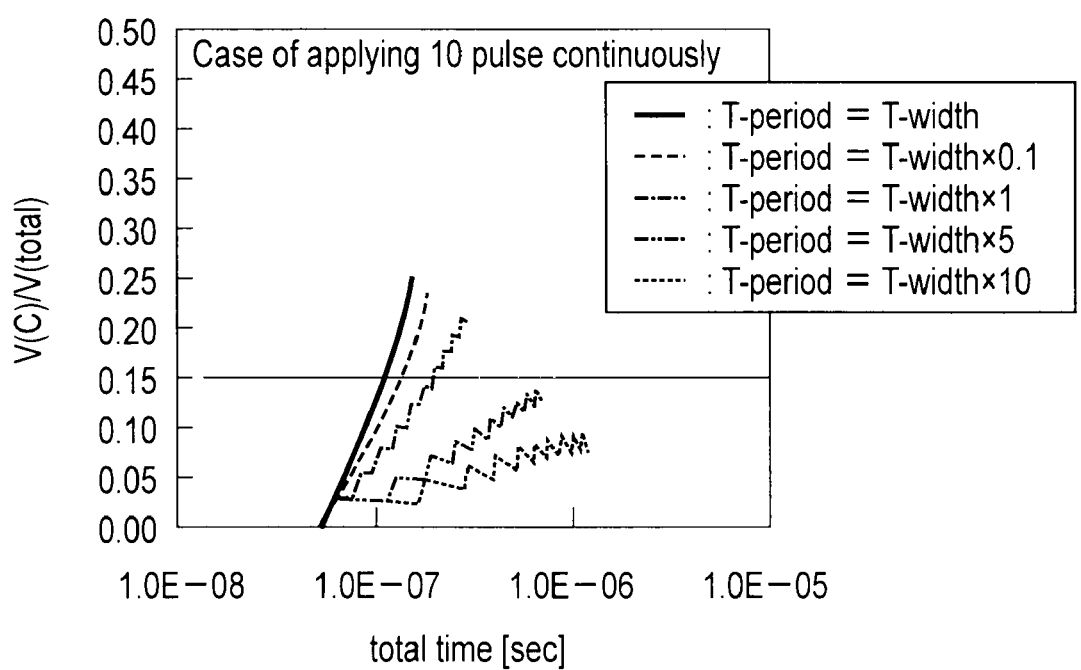
F I G. 10

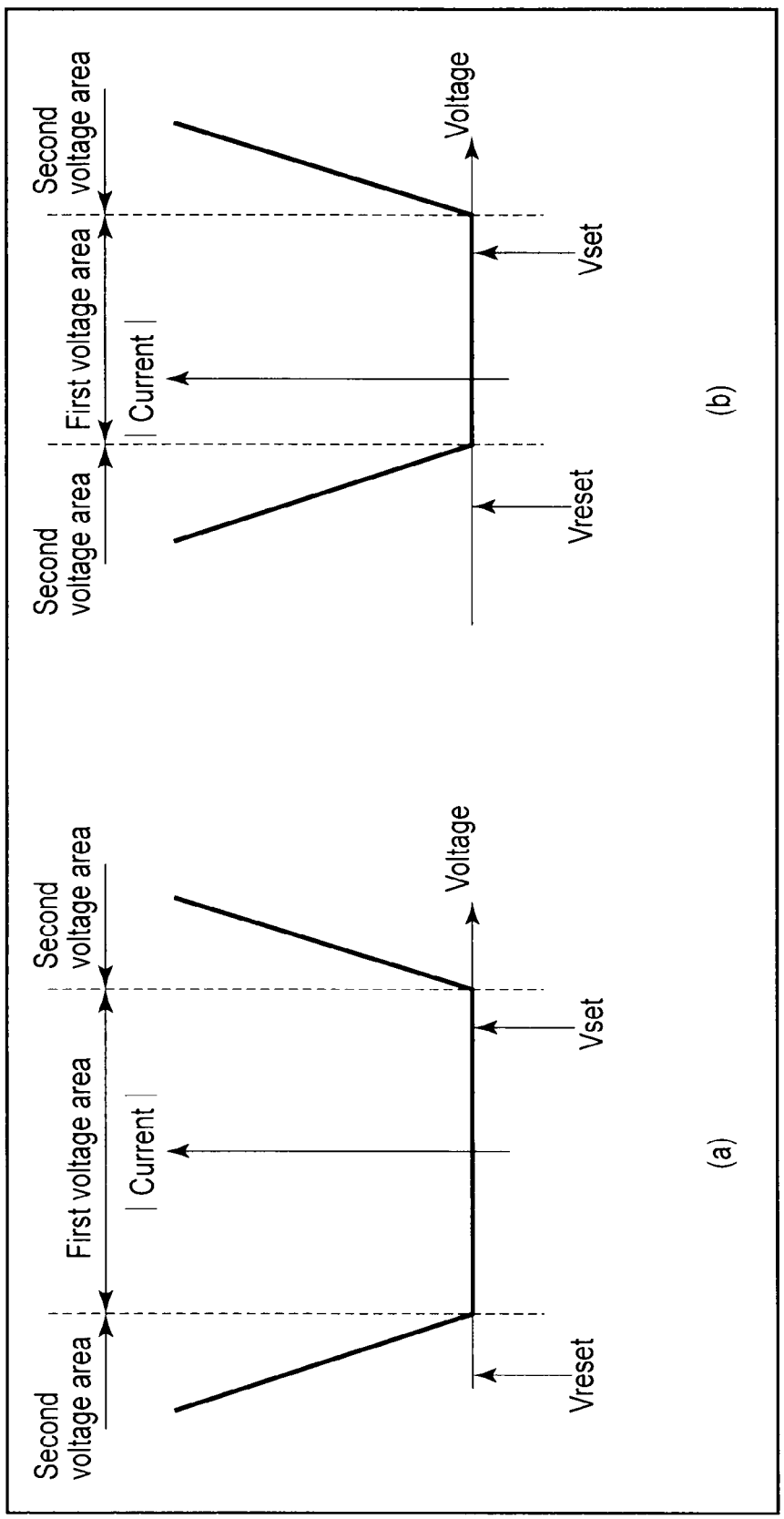
F I G. 12

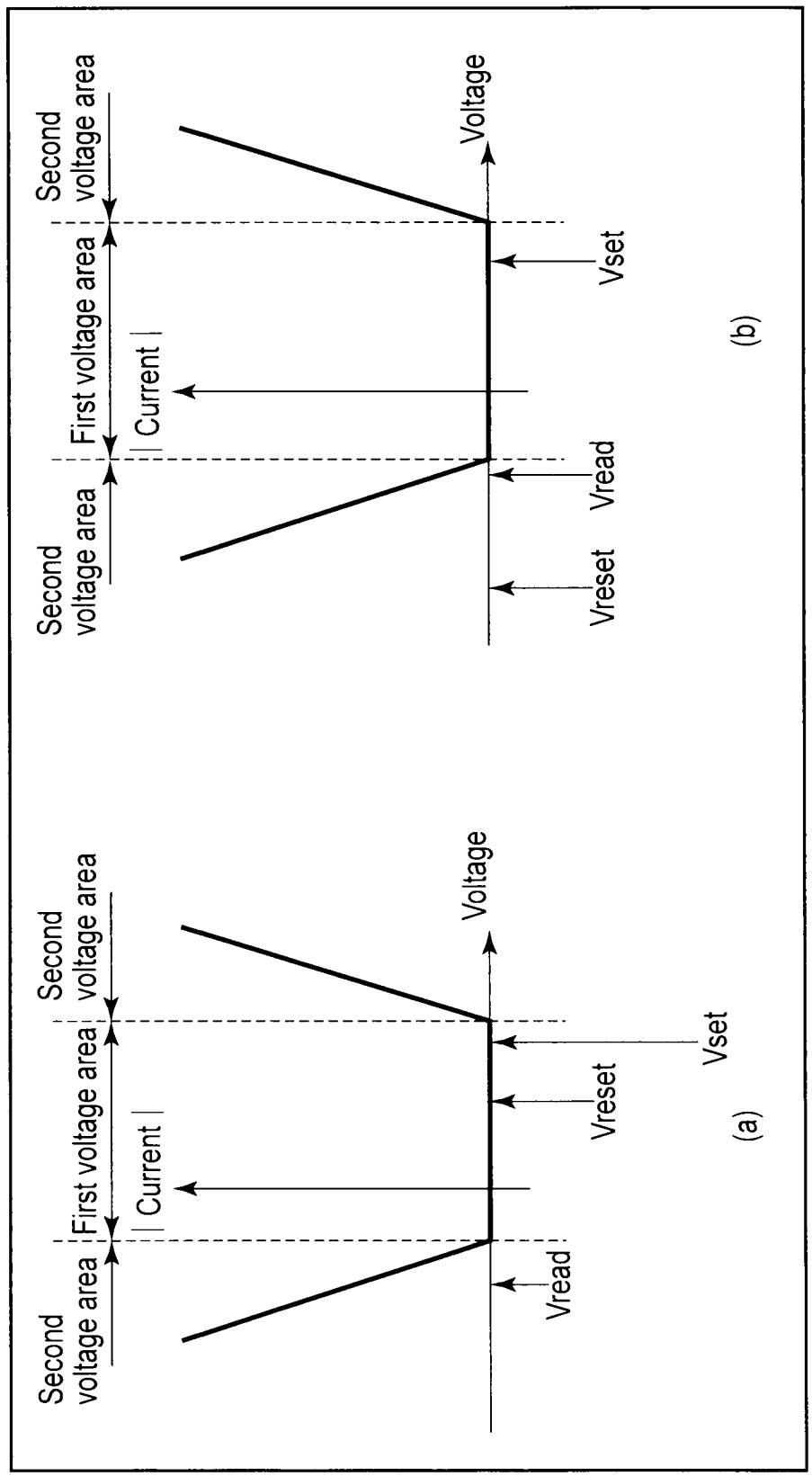
F I G. 13

RESISTANCE CHANGE MEMORY

CROSS-REFERENCE TO RELATED APPLICATIONS

This application is based upon and claims the benefit of priority from prior Japanese Patent Application No. 2011-076283, filed Mar. 30, 2011, the entire contents of which are incorporated herein by reference.

FIELD

Embodiments described herein relate generally to a resistance change memory.

BACKGROUND

Recently, as the integration degree of semiconductor devices increases, the degree of micropatterning of circuit patterns of, e.g., transistors of these devices increases. Since this micropatterning makes interconnections thinner, techniques for increasing the dimensional accuracy and positional accuracy of circuit patterns are necessary. This situation is not an exception in the field of semiconductor memories as well.

Conventionally known commercially available semiconductor memories such as a DRAM, SRAM, and flash memory use a MOSFET as a memory cell. A semiconductor memory like this requires an increase in dimensional accuracy at a ratio higher than that of micropatterning of circuit patterns. This imposes a large load on the photolithography technique of forming fine circuit patterns, and this is one cause of raising the product cost.

A resistance change memory is attracting attention as a memory successor candidate that solves this problem.

The resistance change memory stores data by using a change in resistance value of a resistance change element. Since the resistance change memory is a two-terminal element, it is possible to reduce the cost by using a simplified process, and increase the capacity by using a three-dimensional (cross-point type) resistance change memory. Accordingly, the resistance change memory is expected as a next-generation nonvolatile semiconductor memory.

An operation of changing the resistance value of the resistance change element from a high-resistance state to a low-resistance state in the resistance change memory is performed by applying a voltage pulse to the resistance change element. Also, the resistance value in the low-resistance state after this operation is complete depends on a maximum electric current having flown through the resistance change element during the operation. That is, the resistance value in the low-resistance state varies in accordance with the variation in maximum electric current flowing through the resistance change element during the operation.

To prevent this, a technique that adds a current limiting function of limiting the maximum electric current flowing through the resistance change element to the operation of changing the resistance value of the resistance change element from the high-resistance state to the low-resistance state has been developed. This technique is theoretically capable of holding the maximum electric current flowing through the resistance change element in the low-resistance state constant at the limited current value of a current limiting transistor by using the saturation region of the transistor, thereby preventing the variation in resistance value in the low-resistance state.

Generally, however, the current limiting transistors are arranged in a peripheral circuit region in one-to-one correspondence with rows or columns in a memory cell array region. This produces an RC delay (time lag) caused by the parasitic capacitance of an interconnection (e.g., a word line or bit line) in the memory cell array region, after the resistance value of the resistance change element has changed from the high-resistance state to the low-resistance state and before the current limiting function of the current limiting transistor becomes effective.

In reality, therefore, an electric current exceeding the limited current value of the current limiting transistor flows through the resistance change element in the low-resistance state in the period of this time lag. This makes it impossible to sufficiently achieve the newly added current limiting function. Consequently, the resistance value of the resistance change element in the low-resistance state decreases more than necessary, and varies as well.

This phenomenon becomes conspicuous when memory cells in the memory cell array region are downsized and the resistance of each memory cell increases, and when interconnections (e.g., word lines and bit lines) in the memory cell array region become long as the scale of the memory cell array increases.

On the other hand, adding one current limiting transistor to one resistance change element eliminates the above-described problem caused by the RC delay. However, this makes it necessary to sacrifice features such as a low cost obtained by the use of a simplified process, and a large capacity obtained by the use of a three-dimensional (cross-point type) memory cell array. Since the merits of a two-terminal element are thus spoiled, the use of this arrangement is unrealistic.

BRIEF DESCRIPTION OF THE DRAWINGS

FIG. 1 shows a resistance change memory;
FIG. 2 shows a memory cell array;
FIG. 3 shows an equivalent circuit in a set operation;
FIGS. 4 and 5 show memory cell structures;
FIG. 6 shows a waveform example of a voltage pulse;
FIG. 7 shows voltages applied to a resistance change element and stacked layer structure;
FIG. 8 shows changes in voltage applied to the resistance change element in an OFF state;
FIG. 9 shows changes in voltage applied to the resistance change element in an ON state;
FIG. 10 shows changes in voltage applied to the stacked layer structure; and
FIGS. 11 to 13 show the relationship between a set voltage, reset voltage, and read voltage.

DETAILED DESCRIPTION

Figure 11:
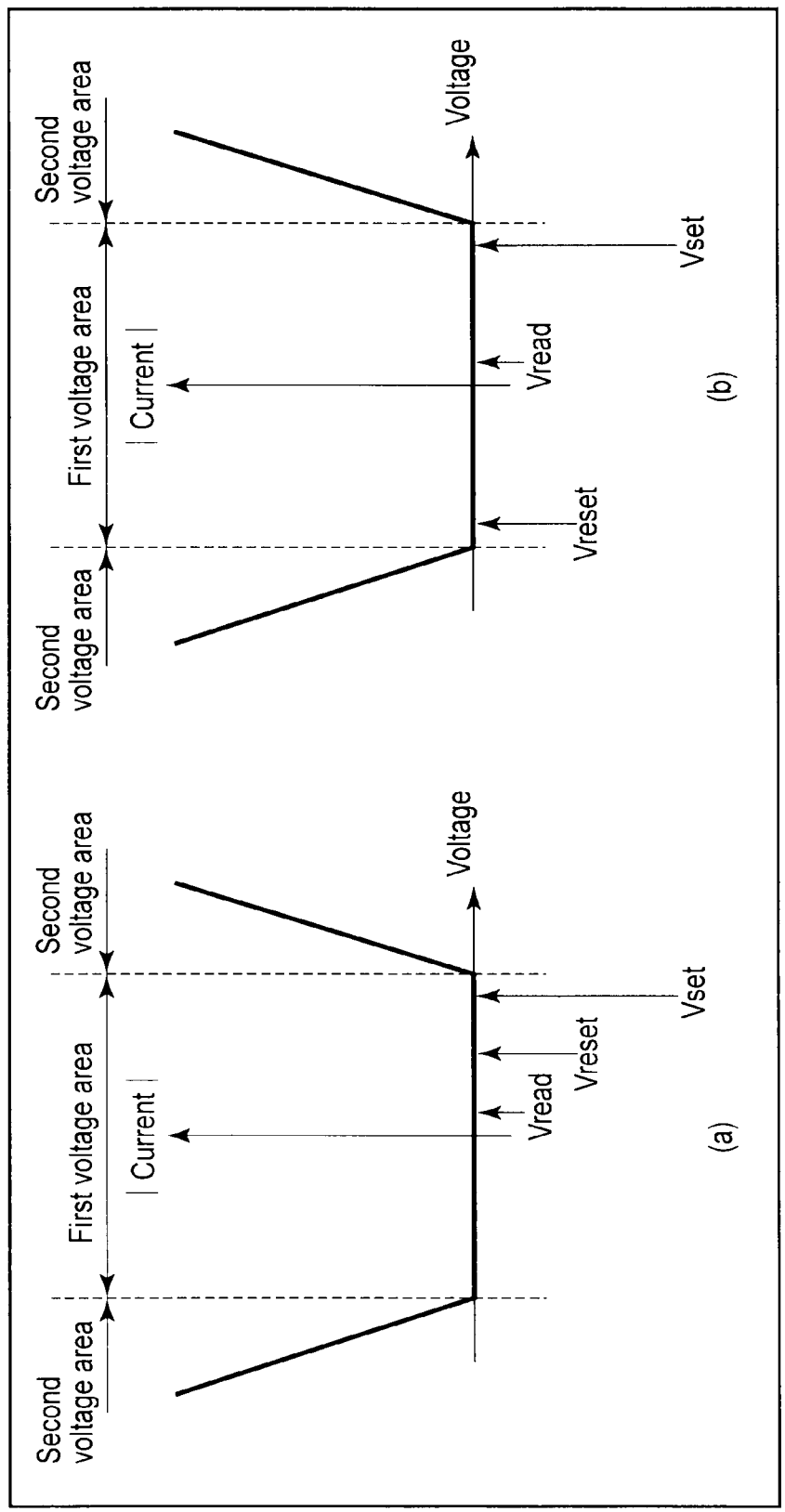

In general, according to one embodiment, a resistance change memory comprising: a memory cell including a resistance change element and a stacked layer structure which are connected in series; a control circuit configured to control a first operation of changing the resistance change element from a first resistance value to a second resistance value lower than the first resistance value; and a voltage pulse generating circuit configured to generate a first voltage pulse to be applied to the memory cell in the first operation, wherein the stacked layer structure includes two conductive layers and an insulating layer formed between the two conductive layers, an amplitude of the first voltage pulse is in a first voltage area in which the stacked layer structure functions as a capacitor, and the first voltage pulse satisfies: Ron×C<T-lead<Roff×C, and Ron×C<T-trail, where T-lead is a rise time [sec] of the first voltage pulse, T-trail is a fall time [sec] of the first voltage pulse, Roff is the first resistance value [Ω], Ron is the second resistance value [Ω], and C is a capacitance [F] of the capacitor.

First, an operation of changing the resistance value of a resistance change element will be defined as follows before the explanation of the embodiment. This definition is adopted in order to make the following explanation easy to understand, and the embodiment is not limited to the definition.

The resistance value of the resistance change element is changed into two states (a low-resistance state/high-resistance state). That is, one resistance change element stores binary data (one bit). It is naturally possible to store multilevel data by changing the resistance value of the resistance change element into three or more states, but the embodiment adopts the definition described above for the sake of descriptive simplicity.

Assume that the initial state of the resistance change element is the high-resistance state. However, this is merely an example, and the initial state of the resistance change element may also be the low-resistance state.

In the following embodiment, an operation of changing the resistance value of the resistance change element from the high-resistance state to the low-resistance state will be defined as a set operation. In a multilevel resistance change element, the low-resistance state has two or more states (e.g., three states for quaternary data). The set operation is performed by, e.g., applying a voltage pulse to the resistance change element.

Also, an operation of changing the resistance value of the resistance change element from the low-resistance state to the high-resistance state will be defined as a reset operation. The reset operation is performed by, e.g., applying a reset voltage (or supplying a reset current) to the resistance change element.

Furthermore, the high-resistance state and low-resistance state of the resistance value of the resistance change element will respectively be referred to as an OFF state and ON state hereinafter.

FIG. 1 shows a resistance change memory of the embodiment. FIG. 2 shows an example of a memory cell array.

Memory cell array 11 is a cross-point type memory cell array in which memory cells MC are arranged at the intersections of upper bit lines UBL1 and UBL2 running in the first direction and lower bit lines LBL1 and LBL2 running in the second direction.

Although this example shows four memory cells MC (two rows and two columns) in order to simplify the explanation, more memory cells exist in an actual memory.

First decoder/driver 12 is formed at one end of memory cell array 11 in the first direction. Second decoder/driver 13 is formed at one end of memory cell array 11 in the second direction.

An FET (Field Effect Transistor) as driver D is connected to one end of each of upper bit lines UBL1 and UBL2 in the first direction. Another FET as driver D is connected to one end of each of lower bit lines LBL1 and LBL2 in the second direction. Decode signals RA1, RA2, CA1, and CA2 from the decoders control ON/OFF of these FETs.

Column and row address signals are input to first and second decoders/drivers 12 and 13 via address buffer 14.

First decoder/driver 12 generates decode signals RA1 and RA2 based on the row address signal, and selects, e.g., one of rows of memory cell array 11. Second decoder/driver 13 generates decode signals CA1 and CA2 based on the column address signal, and selects, e.g., one of columns of memory cell array 11.

Control circuit 22 controls the set operation, the reset operation, and a read operation.

Voltage pulse generating circuit 21 generates, e.g., a first voltage pulse in the set operation, a second voltage pulse in the reset operation, and a third voltage pulse in the read operation.

Voltage pulse generating circuit 21 includes a waveform shaping circuit for determining, e.g., the amplitude, width, period, rise time, and fall time of the first, second, or third voltage pulse in the set, reset, or read operation.

FIG. 3 shows an equivalent circuit of the memory cell array in the set operation.

In the set operation, the voltage pulse is applied, e.g., from upper bit line UBL1 to memory cell MC. In this state, both decode signals RA1 and CA1 are "H (High)", and driver (FET) D is ON.

Current limiting transistor TRc has a current limiting function of limiting a maximum electric current flowing through the resistance change element in the operation (in this example, the set operation) of changing the resistance value of the resistance change element from the high-resistance state to the low-resistance state.

In the set operation, control signal $\phi$ is "H".

Referring to FIG. 3, PC denotes a parasitic capacitance generated on lower bit line LBL1. In the conventional techniques, parasitic capacitance PC produces an RC delay (time lag) after the resistance value of the resistance change element has changed from the high-resistance state to the low-resistance state and before the current limiting function of current limiting transistor TRc becomes effective.

Accordingly, this embodiment proposes a novel technique capable of limiting an electric current flowing through the resistance change element immediately after the resistance value of the resistance change element has changed from the high-resistance state to the low-resistance state regardless of parasitic capacitance PC.

As will be described later, the embodiment implements this current limiting function by the structure of memory cell MC, and the waveform (e.g., the amplitude, width, period, rise time, and fall time) of the voltage pulse applied to memory cell MC in the set operation.

In this embodiment, therefore, the controllability of the resistance value of the resistance change element in low-resistance state (the prevention of variations) improves, and current limiting transistor TRc can be omitted. This helps reduce the size of a peripheral circuit.

It is, however, also possible to use the current limiting functions of both the embodiment and current limiting transistor TRc without omitting it.

First, the memory cell structure as the first condition of the resistance change memory of the embodiment will be explained.

FIG. 4 shows examples of the memory cell structure.

In the first example, stacked layer structure C is formed above lower bit line LBL1. Stacked layer structure C includes first conductive layer (e.g., metal layer) M1, insulating layer I on first conductive layer M1, and second conductive layer (e.g., metal layer) M2 on insulating layer I.

When a voltage applied across first and second conductive layers M1 and M2 is in a first voltage area, stacked layer structure C functions as a capacitor that allows almost no electric current to flow. When the voltage applied across first and second conductive layers M1 and M2 is in a second voltage area, stacked layer structure C functions in the same manner as a diode in an area in which the voltage is equal to or higher than the threshold voltage of a rectifying element (e.g., an MIM diode or PIN diode).

Resistance change element RW is formed on stacked layer structure C. Resistance change element RW is made of a resistance change material that changes its resistance value in response to a voltage pulse or electric current.

In an ReRAM (Resistive Random Access Memory), resistance change element RW is made of a metal oxide, e.g., Al oxide, Hf oxide, Ti oxide, or La oxide, or a mixture of these oxides.

In this arrangement, insulating layer I in stacked layer structure C is desirably made of, e.g., Al oxide, Hf oxide, Ti oxide, La oxide, or a mixture of these oxides. This is so because when insulating layer I and resistance change element RW are made of the same metal element and oxygen, it is possible to simplify the wafer process and reduce the manufacturing cost.

Another reason is that these metal oxides function as resistance change materials or insulating materials in accordance with their oxygen concentrations. For example, these metal oxides function as resistance change materials if their oxygen concentrations are lower than a predetermined value, and as insulating materials if their oxygen concentrations are higher than the predetermined value.

FIG. 5 shows an example in which insulating layer I and resistance change element RW in stacked layer structure C are made of the same metal element and oxygen. Referring to FIG. 5, the composition ratio of oxygen O in insulating layer I is higher than that in resistance change element RW.

Third conductive layer (e.g., metal layer) M3 is formed on resistance change element RW. Upper bit line UBL1 is formed above third conductive layer M3.

In the second example, first conductive layer (e.g., metal layer) M1 is formed above lower bit line LBL1. Resistance change element RW is formed on first conductive layer M1. Stacked layer structure C is formed on resistance change element RW. Upper bit line UBL1 is formed above stacked layer structure C.

Stacked layer structure C includes second conductive layer (e.g., metal layer) M2, insulating layer I on second conductive layer M2, and third conductive layer (e.g., metal layer) M3 on insulating layer I.

The functions of stacked layer structure C and the materials forming insulating layer I and resistance change element RW are the same as those of the first example described above, so a repetitive explanation will be omitted.

Note that in the first and second examples, first, second, and third conductive layers M1, M2, and M3 are desirably made of the same material, but they may also be made of different materials.

The waveform of the first voltage pulse applied to the memory cell in the set operation will now be explained as the second condition of the resistance change memory of the embodiment.

The first voltage pulse can be one voltage pulse, and can also be a set of continuous voltage pulses. In the following explanation, as shown in FIG. 6, the first voltage pulse is the latter, i.e., a set of continuous voltage pulses.

Also, the amplitude, width, period, rise time, and fall time of the first voltage pulse are defined as shown in FIG. 6.

Referring to FIG. 6, Vamp is the amplitude, T-width is the pulse width, T-period is the pulse period, T-lead is the rise time, and T-trail is the fall time. T-width extends from the midpoint of T-lead to that of T-trail. T-period extends from the midpoint of T-lead to that of next T-lead.

The amplitude of the first voltage pulse is in a first voltage area (see FIGS. 11 and 12) in which stacked layer structure C shown in FIG. 4 functions as a capacitor.

Also, the first voltage pulse is determined under the following conditions:

A. When resistance change element RW is in the high-resistance state (OFF state), a sufficient set voltage to change resistance change element RW from the high-resistance state to the low-resistance state is applied to resistance change element RW.

B. When resistance change element RW is in the low-resistance state (ON state), a change in resistance value in the low-resistance state caused by an electric current flowing through resistance change element RW (a voltage applied to resistance change element RW) is sufficiently small.

[Condition A]

No steady electric current flows through the series circuit (memory cell MC) including resistance change element RW and stacked layer structure (capacitor) C shown in FIG. 4 (no voltage is applied to resistance change element RW). However, a sufficiently high set voltage can be applied to resistance change element RW in the OFF state by using a transient response.

For this purpose, the first voltage pulse satisfies $$T\text{-lead} < R\text{off} \times C \qquad (1)$$

where T-lead is the rise time [sec] of the first voltage pulse, Roff is the resistance value (first resistance value) [Ω] of resistance change element RW in the OFF state, and C is the capacitance [F] of stacked layer structure (capacitor) C.

[Condition B]

By using the transient response of the series circuit (memory cell MC) including resistance change element RW and stacked layer structure (capacitor) C shown in FIG. 4, it is possible to decrease the voltage applied to resistance change element RW in the ON state, and sufficiently decrease the electric current flowing through resistance change element RW.

For this purpose, the first voltage pulse satisfies $$Ron \times C < T\text{-lead} \qquad (2)$$

$$Ron \times C < T\text{-trail} \qquad (3)$$

where T-lead is the rise time [sec] of the first voltage pulse, T-trail is the fall time [sec] of the first voltage pulse, Ron is the resistance value (second resistance value) [Ω] of resistance change element RW in the ON state, and C is the capacitance [F] of stacked layer structure (capacitor) C.

The effect obtained when the first condition (the memory cell structure) and the second condition (the waveform of the first voltage pulse) described above are met will be explained below.

FIG. 7 shows voltages applied to the resistance change element and stacked layer structure (capacitor) before and after the set operation.

Referring to FIG. 7, V(RW) is a voltage applied to resistance change element RW, V(C) is a voltage applied to the stacked layer structure (capacitor), and V(total) is the total of voltage V(RW) applied to resistance change element RW and voltage V(C) applied to the stacked layer structure (capacitor).

Before the set operation (when resistance change element RW is in the OFF state), most of the amplitude (voltage) of the first voltage pulse is applied to resistance change element RW. By contrast, after the set operation (when resistance change element RW is in the ON state), most of the amplitude (voltage) of the first voltage pulse is applied to stacked layer structure (capacitor) C.

Note that the first voltage pulse has the waveform shown in FIG. 6, T-lead=T-trail=3 [ns], T-width=10 [ns], and Tperiod=100 [ns].

Note also that the structure shown in FIG. 4 is used as the memory cell to which the first voltage pulse is applied, resistance value Ron of resistance change element RW in the ON state is 10 [MΩ], and resistance value Roff of resistance change element RW in the OFF state is 10 [GΩ]. Furthermore, the thickness of the insulating layer in the stacked layer structure is 5 [nm], and the dielectric constant of the insulating layer in the stacked layer structure is 15.

As is apparent from the results shown in FIG. 7, when resistance change element RW is in the OFF state, 90% or more of the amplitude (voltage) of the first voltage pulse is applied to resistance change element RW. By contrast, when resistance change element RW is in the ON state, 10% or less of the amplitude (voltage) of the first voltage pulse is applied to resistance change element RW.

Accordingly, when resistance change element RW changes from the high-resistance state to the low-resistance state, the voltage applied to resistance change element RW instantaneously decreases. This makes it possible to immediately limit the electric current flowing through resistance change element RW without any time lag produced by the conventional techniques.

[First Modification of Condition A]

A maximum voltage applied to resistance change element RW in the OFF state increases as T-lead shortens.

Accordingly, the first voltage pulse desirably further satisfies $$T\text{-lead} \leq R\text{off} \times C \times 0.3 \tag{4}$$

This is so because if expression (4) is met, 80% or more of the amplitude (voltage) of the first voltage pulse is applied to resistance change element RW as shown in FIG. 8, and this can prevent an excessive increase in amplitude of the first voltage pulse.

Referring to FIG. 8, when T-lead=Roff×C×1, about 60% of the amplitude of the first voltage pulse is applied to resistance change element RW. This can change resistance change element RW from the high-resistance state to the low-resistance state.

However, assuming that the set voltage is constant, the amplitude of the first voltage pulse when T-lead=Roff×C×1 must be made larger than that of the first voltage pulse when T-lead=Roff×C×0.3.

Since an internal boosting circuit of the memory chip (resistance change memory) generates a high voltage, therefore, applying 80% or more of the amplitude (voltage) of the first voltage pulse to resistance change element RW under the condition indicated by expression (4) is very effective from the viewpoint of design.

[Second Modification of Condition A]

A condition under which a sufficiently high set voltage is applied to resistance change element RW in the OFF state and no unnecessary voltage stress is given to insulating layer I of stacked layer structure C will be explained below.

As explained in the first modification, the maximum voltage applied to resistance change element RW in the OFF state increases as T-lead shortens. Therefore, T-width is not limited as long as resistance change element RW is changed from the high-resistance state to the low-resistance state.

If T-width is much longer than the time constant described by Roff×C, however, the voltage applied to insulating layer I of stacked layer structure C increases with the elapse of time. Therefore, an unnecessary voltage stress is applied to insulating layer I of stacked layer structure C. As a consequence, insulating layer I deteriorates, and the function of stacked layer structure C as a capacitor degrades.

Accordingly, the first voltage pulse desirably further satisfies $$T\text{-width} \leq R\text{off} \times C \times 0.3 \tag{5}$$

Note that when T-lead<T-width and T-trail<T-width, the condition of the first modification is met at the same time the condition of the second modification is met.

[Modification of Condition B]

When set (the change from the OFF state to the ON state) is complete during the set operation, as indicated by condition B, it is necessary to sufficiently decrease the voltage applied to resistance change element RW in the ON state, thereby sufficiently decreasing the electric current flowing through resistance change element RW.

Even when the first voltage pulse satisfies condition B, i.e., expressions (2) and (3), the voltage applied to resistance change element RW in the ON state increases as T-lead and T-trail shorten. Therefore, a condition that further improves the controllability of the resistance value of resistance change element RW in the ON state will be explained below.

FIG. 9 shows the change in voltage applied to resistance change element RW in the ON state by using T-lead and T-trail as parameters.

Assume that T-lead and T-trail are equal in this example.

Assume also that when the voltage applied to resistance change element RW at the leading edge (T-lead) of the first voltage pulse is positive, the voltage applied to resistance change element RW at the trailing edge (T-trail) of the first voltage pulse is negative.

That is, the direction of the electric current flowing at the leading edge (T-lead) of the first voltage pulse is opposite to that of the electric current flowing at the trailing edge (T-trail) of the first voltage pulse.

Furthermore, assume that pulse width T-width of the first voltage pulse is sufficiently large to such an extent that the voltage applied to resistance change element RW at the trailing edge (T-trail) of the first voltage pulse is independent of T-width. The voltage applied to resistance change element RW at the leading edge (T-lead) of the first voltage pulse is independent of pulse width T-width of the first voltage pulse.

Referring to FIG. 9, when T-lead and T-trail are equal to or longer than Ron×C×10, the voltage applied to resistance change element RW in the ON state is 0.1 or less of the amplitude of the first voltage pulse.

Accordingly, the first voltage pulse desirably further satisfies $$T\text{-lead} \geq R\text{on} \times C \times 10 \tag{6}$$

$$T\text{-trail} \geq R\text{on} \times C \times 10 \tag{7}$$

[Another Condition]

A condition under which the maximum voltage applied to resistance change element RW does not become lower than a predetermined value (a condition that suppresses the change in maximum voltage applied to resistance change element RW) when the first voltage pulse is a set of continuous voltage pulses will be explained below.

FIG. 10 shows the change in voltage applied to stacked layer structure (capacitor) C when voltage pulses are continuously applied.

Assume that the number of voltage pulses is 10 in this example.

Voltage V(RW) applied to resistance change element RW is represented by $$V(RW) = V(\text{total}) - V(C) \tag{8}$$

As shown in FIG. 10, when voltage pulses are continuously applied to the memory cell, the voltage applied to stacked layer structure (capacitor) C gradually increases. This means that the maximum voltage applied to resistance change element RW gradually decreases.

Note that V(C)/V(total) is desirably 0.15 or less in order that the maximum voltage applied to resistance change element RW does not become lower than a predetermined value required for the set operation.

On the other hand, as shown in FIG. 10, an example in which V(C)/V(total) is 0.15 or less after the voltage pulses are applied includes two cases in which T-period=T-width×5 and T-period=T-width×10.

Accordingly, when the first voltage pulse is a set of 10 or less voltage pulses, the first voltage pulse desirably satisfies $$T\text{-period} \geq T\text{-width} \times 5 \tag{9}$$

When expression (9) is met, the change in maximum voltage applied to resistance change element RW can be suppressed in the set operation. This makes it possible to avoid an event in which the maximum voltage applied to resistance change element RW becomes lower than the predetermined value.

Next, the reset operation and read operation will be explained.

The reset operation and read operation can be performed by a first operation using a transient response when stacked layer structure C is used as a capacitor in the same manner as in the set operation, or a second operation using a steady state when stacked layer structure C is used as an element through which an electric current flows.

[First Operation]

Reset Operation

The reset operation uses the transient response in the same manner as in the set operation. In this case, to apply a sufficient voltage to resistance change element RW in the ON state, the second voltage pulse must satisfy the following expressions for the same reason as that in the set operation.

$$T\text{-lead} \leq Ron \times C \times 0.3 \tag{10}$$

$$T\text{-trail} \leq Ron \times C \times 0.3 \tag{11}$$

In addition, the following expressions desirably hold for the same reason as that in the set operation.

$$T\text{-width} \leq Ron \times C \times 0.3 \tag{12}$$

$$T\text{-period} \geq T\text{-width} \times 5 \tag{13}$$

Read Operation

By applying the third voltage pulse, the read operation also uses the transient response in the same manner as in the set operation. In this case, to apply sufficient voltages to resistance change element RW in both the ON and OFF states, the third voltage pulse must satisfy the following expressions for the same reason as that in the set operation.

$$T\text{-lead} \leq Ron \times C \times 0.3 \tag{14}$$

$$T\text{-trail} \geq Ron \times C \times 0.3 \tag{15}$$

In addition, the following expressions desirably hold for the same reason as that in the set operation.

$$T\text{-width} \leq Ron \times C \times 0.3 \tag{16}$$

$$T\text{-period} \geq T\text{-width} \times 5 \tag{17}$$

FIG. 11 illustrates an example of the relationship between set voltage Vset, reset voltage Vreset, and read voltage Vread.

In FIG. 11, part (a) shows an example using a unipolar resistance change element for which the polarities of the set voltage and reset voltage are the same. When using the same unipolar resistance change element, it must be noted that when resistance change element RW is changed from the ON state to the OFF state by the reset operation, rise time T-lead of an applied pulse decreases relative to the time constant of the memory cell (the time constant of the memory cell changes from Ron×C to Roff×C).

In this state, the voltage applied to resistance change element RW increases depending on the condition. If this voltage exceeds the set voltage, the resistance change element once turned off is set again, and the operation becomes unstable. To avoid this problem, the voltage applied to resistance change element RW in the OFF state must be much lower than set voltage Vset. To this end, the reset voltage must be lower than the set voltage.

On the other hand, in the set operation of this embodiment, at the moment the resistance change element is turned on, the voltage applied to the resistance change element is suppressed. Even when the set voltage is higher than the reset voltage, therefore, the resistance change element once turned on in the set operation is not reset again.

Part (a) in FIG. 11, the amplitude of read voltage Vread must be smaller than those of set voltage Vset and reset voltage Vreset. That is, to prevent a write error and erase error in the read operation, absolute value |Vread| of the read voltage is much smaller than absolute value |Vset| of the set voltage and absolute value |Vreset| of the reset voltage.

Furthermore, part (a) in FIG. 11 shows the example in which the polarity of read voltage Vread is the same as that of set voltage Vset and reset voltage Vreset, but the polarity of read voltage Vread may also be different from that of set voltage Vset and reset voltage Vreset. In this case, the amplitude of read voltage Vread is not particularly limited.

In FIG. 11, part (b) shows an example using a bipolar resistance change element for which the polarity of the set voltage is opposite to that of the reset voltage. In this case, the polarities of the operating voltages of reset and set are different, so the problem of the unipolar resistance change element, i.e., the problem that the operation becomes unstable because the element is set again in the reset operation does not arise. Accordingly, the relationship between absolute value |Vset| of the set voltage and absolute value |Vreset| of the reset voltage is not particularly limited.

Also, part (b) in FIG. 11 shows the example in which the polarity of read voltage Vread is the same as that of set voltage Vset, but the polarity of read voltage Vread may also be the same as that of reset voltage Vreset. In the former case, absolute value |Vread| of the read voltage must be smaller than absolute value |Vset| of the set voltage. In the latter case, absolute value |Vread| of the read voltage must be smaller than absolute value Vreset of the reset voltage.

[Second Operation]

Reset Operation

A case in which the steady state is used in the reset operation will be explained below.

In the reset operation, the second voltage pulse required for the reset operation is applied to resistance change element RW in the ON state by using a voltage area in which stacked layer structure C allows an electric current to flow.

To apply a voltage to resistance change element RW in the steady state, electric current Ireset necessary to reset resistance change element RW must be supplied to insulating layer I of the capacitor, and it is necessary to use the characteristics of an MIM diode as shown in FIG. 12. On the other hand, the feature of this embodiment is to use the transient response in the set operation, so Vset must fall within the range of the first voltage area in which insulating layer I functions as a capacitance.

Accordingly, |Vset|<|Vreset| must hold as shown part (a) in FIG. 12, or the IV characteristic of the MIM diode must be asymmetrical with respect to the polarity and must satisfy the condition that an electric current starts flowing at a voltage lower than |Vset| for the polarity on the Vreset side as shown part (b) in FIG. 12. In either of the methods shown part (a) and part (b) in FIG. 12, the polarities of Vset and Vreset must be opposite (bipolar) in the operation method of resistance change element RW.

A bipolar element is necessary even in the method shown part (a) in FIG. 12 for the reason explained below. That is, in this embodiment in which |Vreset|>|Vset| must hold, a voltage exceeding |Vset| is applied to the resistance change element even when it is turned off in the reset operation. If the resistance change element is a unipolar element, therefore, the element is set again, and this makes it difficult to hold resistance change element RW in the high-resistance state.

Read Operation

A case in which the steady state is used in the read operation by applying the third voltage pulse will be explained below. In this case, electric current Iread that flows through resistance change element RW when the voltage necessary for read is applied to the resistance change element must flow through insulating layer I of the capacitor. Read voltage Vread must fall within the range of the second voltage area by using the characteristics of an MIM diode as shown in FIG. 13.

On the other hand, the feature of this embodiment is to use the transient response in the set operation, so Vset must fall within the range of the first voltage area in which insulating layer I functions as a capacitance. For the reason described above, the polarities of the read voltage and set voltage must be different in order to avoid a write error in the read operation. This is so because if the polarities of the read voltage and set voltage are the same, absolute value |Vread| of the read voltage is necessarily larger than absolute value |Vset| of the set voltage in this embodiment, so a write error in the read operation cannot be avoided.

In FIG. 13, part (a) shows an example using a unipolar resistance change element. Read voltage Vread has a polarity different from that of set voltage Vset and reset voltage Vreset, and falls within the range of the second voltage area.

In FIG. 13, part (b) shows an example using a bipolar resistance change element. As described previously, when using the steady state in the read operation, the polarities of read voltage Vread and set voltage Vset must be different. That is, in a bipolar resistance change element, the polarities of read voltage Vread and reset voltage Vreset are the same.

Referring to part (b) in FIG. 13, both read voltage Vread and reset voltage Vreset exist in the second voltage area because the steady state is used in the read operation and reset operation. In this case, absolute value |Vread| of the read voltage is made smaller than absolute value |Vreset| of the reset voltage.

It is also possible to set read voltage Vread in the first voltage area by using the transient response in the read operation. When the polarity of read voltage Vread is made the same as that of reset voltage Vreset, the amplitude of read voltage Vread must be made smaller than that of reset voltage Vreset. When the polarity of read voltage Vread is made the same as that of set voltage Vset, the amplitude of read voltage Vread must be made smaller than that of set voltage Vset.

4. Conclusion

In the embodiment as has been explained above, in the operation of changing the resistance change element from the high-resistance state to the low-resistance state, it is possible to prevent variations in resistance value in the low-resistance state by the novel technique that limits the electric current flowing through the resistance change element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a memory cell including a resistance change element and a stacked layer structure which are connected in series;
   a control circuit configured to control a first operation of changing the resistance change element from a first resistance value to a second resistance value lower than the first resistance value; and
   a voltage pulse generating circuit configured to generate a first voltage pulse to be applied to the memory cell in the first operation,
   wherein the stacked layer structure includes two conductive layers and an insulating layer formed between the two conductive layers,
   an amplitude of the first voltage pulse is in a first voltage area in which the stacked layer structure functions as a capacitor, and
   the first voltage pulse satisfies $$Ron \times C < T\text{-lead} < Roff \times C$$

$$Ron \times C < T\text{-trail}$$

where T-lead is a rise time [sec] of the first voltage pulse, T-trail is a fall time [sec] of the first voltage pulse, Roff is the first resistance value [Ω], Ron is the second resistance value [Ω], and C is a capacitance [F] of the capacitor.

2. The memory of claim 1, wherein the first voltage pulse further satisfies T-lead$\leq$Roff$\times$C$\times$0.3.

3. The memory of claim 1, wherein the first voltage pulse further satisfies T-lead$\geq$Ron$\times$C$\times$10 and T-trail$\geq$Ron$\times$C$\times$10.

4. The memory of claim 1, wherein the first voltage pulse is a set of not more than 10 continuous voltage pulses, and satisfies $$T\text{-period} \geq T\text{-width} \times 5$$

where T-period is a period of the voltage pulses, and T-width is a pulse width of the voltage pulses.

5. The memory of claim 1, wherein the first voltage pulse further satisfies T-width$\leq$Roff$\times$C$\times$0.3.

6. The memory of claim 1, wherein the insulating layer comprises at least one of Al oxide, Hf oxide, Ti oxide, and La oxide.

7. The memory of claim 1, wherein the resistance change element comprises at least one of Al oxide, Hf oxide, Ti oxide, and La oxide.

8. The memory of claim 1, wherein the insulating layer and the resistance change element comprise the same metal element and oxygen, and an oxygen concentration in the insulating layer is higher than that in the resistance change element.

9. The memory of claim 1, wherein
the control circuit is configured to control a second operation of changing the resistance change element from the second resistance value to the first resistance value,
the voltage pulse generating circuit is configured to generate a second voltage pulse to be applied to the memory cell in the second operation,
a polarity of the second voltage pulse is the same as that of the first voltage pulse, and
an amplitude of the second voltage pulse is in the first voltage area, and smaller than that of the first voltage pulse.

10. The memory of claim 9, wherein
the control circuit is configured to control a third operation of reading a resistance value of the resistance change element,
the voltage pulse generating circuit is configured to generate a third voltage pulse to be applied to the memory cell in the third operation,
a polarity of the third voltage pulse is the same as that of the first voltage pulse, and
an amplitude of the third voltage pulse is in the first voltage area, and smaller than those of the first voltage pulse and the second voltage pulse.

11. The memory of claim 9, wherein
the control circuit is configured to control a third operation of reading a resistance value of the resistance change element,
the voltage pulse generating circuit is configured to generate a third voltage pulse to be applied to the memory cell in the third operation,
a polarity of the third voltage pulse is different from that of the first voltage pulse, and
an amplitude of the third voltage pulse is in a second voltage area in which the stacked layer structure functions as an element which is capable of flowing a current.

12. The memory of claim 1, wherein
the control circuit is configured to control a second operation of changing the resistance change element from the second resistance value to the first resistance value,
the voltage pulse generating circuit is configured to generate a second voltage pulse to be applied to the memory cell in the second operation,
a polarity of the second voltage pulse is different from that of the first voltage pulse, and
an amplitude of the second voltage pulse is in the first voltage area.

13. The memory of claim 12, wherein
the control circuit is configured to control a third operation of reading a resistance value of the resistance change element,
the voltage pulse generating circuit is configured to generate a third voltage pulse to be applied to the memory cell in the third operation,
a polarity of the third voltage pulse is the same as that of the first voltage pulse, and
an amplitude of the third voltage pulse is in the first voltage area, and smaller than that of the first voltage pulse.

14. The memory of claim 12, wherein
the control circuit is configured to control a third operation of reading a resistance value of the resistance change element,
the voltage pulse generating circuit is configured to generate a third voltage pulse to be applied to the memory cell in the third operation,
a polarity of the third voltage pulse is the same as that of the second voltage pulse, and
an amplitude of the third voltage pulse is in the first voltage area, and smaller than that of the second voltage pulse.

15. The memory of claim 1, wherein
the control circuit is configured to control a second operation of changing the resistance change element from the second resistance value to the first resistance value,
the voltage pulse generating circuit is configured to generate a second voltage pulse to be applied to the memory cell in the second operation,
a polarity of the second voltage pulse is different from that of the first voltage pulse, and
an amplitude of the second voltage pulse is in a second voltage area in which the stacked layer structure functions as an element which is capable of flowing a current.

16. The memory of claim 15, wherein
the control circuit is configured to control a third operation of reading a resistance value of the resistance change element,
the voltage pulse generating circuit is configured to generate a third voltage pulse to be applied to the memory cell in the third operation,
a polarity of the third voltage pulse is different from that of the first voltage pulse, and
an amplitude of the third voltage pulse is in the second voltage area, and smaller than that of the second voltage pulse.

* * * * *